United States Patent
Uppili et al.

(10) Patent No.: US 12,525,454 B2
(45) Date of Patent: Jan. 13, 2026

(54) LASER INDUCED SEMICONDUCTOR WAFER PATTERNING

(71) Applicant: Monolithic Power Systems, Inc., Kirkland, WA (US)

(72) Inventors: Sudarsan Uppili, Portland, OR (US); Vipindas Pala, San Jose, CA (US); Carl Johnson, Fairview, TX (US); Chan Wu, Suzhou (CN); John Trepl, II, Dana Point, CA (US)

(73) Assignee: Monolithic Power Systems, Inc., Kirkland, WA (US)

( * ) Notice: Subject to any disclaimer, the term of this patent is extended or adjusted under 35 U.S.C. 154(b) by 764 days.

(21) Appl. No.: 17/751,424

(22) Filed: May 23, 2022

(65) Prior Publication Data

US 2022/0406601 A1     Dec. 22, 2022

Related U.S. Application Data

(60) Provisional application No. 63/211,459, filed on Jun. 16, 2021.

(51) Int. Cl.
*H01L 21/268*     (2006.01)
*H01L 21/304*     (2006.01)
*H01L 21/3065*    (2006.01)

(52) U.S. Cl.
CPC ........ *H01L 21/268* (2013.01); *H01L 21/304* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 9,847,258 B2 * | 12/2017 | Rohleder | H01L 21/67092 |
| 2014/0213042 A1 * | 7/2014 | Lei | H01L 21/0271 438/462 |
| 2016/0074968 A1 * | 3/2016 | Souter | B23K 26/361 430/5 |

* cited by examiner

*Primary Examiner* — Stephanie P Duclair
(74) *Attorney, Agent, or Firm* — Perkins Coie LLP

(57) ABSTRACT

A semiconductor wafer processing method, having: ablating a back side of a semiconductor wafer with a laser ablation process; and etching the back side of the semiconductor wafer with an etching process; wherein the laser ablation process forms a pattern in the back side of the semiconductor wafer; wherein the etching process preserves the pattern in the back side of the semiconductor wafer.

20 Claims, 5 Drawing Sheets

LASER INDUCED SEMICONDUCTOR WAFER PATTERNING

CROSS-REFERENCE TO RELATED APPLICATION

This application claims the benefit of U.S. Provisional Application No. 63/211,459, filed on Jun. 16, 2021, which is incorporated herein by reference in its entirety.

TECHNICAL FIELD

The present invention generally relates to semiconductor manufacture, and more particularly but not exclusively relates to semiconductor wafer patterning process.

BACKGROUND

Semiconductor devices are usually formed on a semiconductor substrate. The thickness of the semiconductor substrate may add resistance to the semiconductor devices, especially to the vertical power devices. The resistance of the semiconductor substrate may severely impact the performance of the vertical power devices.

To reduce the resistance of the semiconductor substrate, one approach is to remove as much substrate material as possible. Normally the reduction is done by wafer grinding near the end of the fabrication process. However, wafer warpage and wafer breakage happen when the wafer thickness is ground below 100 micron.

Portions of the substrate can also be selectively thinned using etching with or without a mask. Generally, the semiconductor wafer is covered by a layer of photosensitive materials, and then exposed to light through a hard mask to transfer a negative of the hard mask's pattern to the surface of the semiconductor wafer. The photosensitive materials that remain on the semiconductor wafer are then used to protect portions of the wafer during one or more etching steps in which portions of the semiconductor material are removed while the protected portions remain. As such, it is not the light itself that removes portions of the semiconductor material in traditional photolithography, but the etching treatment that is applied once light has been used to transfer the pattern to the wafer. However, photolithography process needs several steps and multiple masks which increase costs.

SUMMARY

It is an object of the present invention to provide a semiconductor wafer processing method to ablate a back side of the wafer to form a specified pattern with an ablated portion and a negative of the ablated portion, wherein the ablation portion has a thickness that could vary within a range.

The embodiments of the present invention are directed to a semiconductor wafer processing method, comprising: ablating a back side of a semiconductor wafer with a laser ablation process; and etching the back side of the semiconductor wafer with an etching process; wherein the laser ablation process forms a pattern in the back side of the semiconductor wafer; and wherein the etching process preserves the pattern in the back side of the semiconductor wafer.

In one embodiment, the etching process is conducted after the laser ablation process.

In one embodiment, the etching process and the laser ablation process are conducted simultaneously.

In one embodiment, the pattern in the back side of the semiconductor wafer has a single depth and is formed by the laser ablation process with single pass and single power level.

In one embodiment, the pattern in the back side of the semiconductor wafer has a plurality of depths and is formed by the laser ablation process with at least one of: (i) multiple passes; and (ii) multiple power levels.

In one embodiment, the etching process comprises a blanket anisometric etch applied to the back side of the semiconductor wafer; and the etching process preserves the pattern while reducing an average wafer thickness of the semiconductor wafer.

In one embodiment, the etching process is a blanket etch, is at least partially isometric, and is applied to the back side of the semiconductor wafer; and the etching process preserves the pattern while reducing an average wafer thickness of the semiconductor wafer.

In one embodiment, the etching process comprises a reactive ion etching process.

In one embodiment, the pattern is defined by an ablated portion of the back side of the semiconductor wafer and a negative of the ablated portion; and the negative of the ablated portion is located below at least one of: (i) scribe areas of the semiconductor wafer; and (ii) wire bond areas of the semiconductor wafer.

In one embodiment, the pattern is defined by an ablated portion of the back side of the semiconductor wafer and a negative of the ablated portion; and the negative of the ablated portion is located below at least one of: (i) scribe areas of the semiconductor wafer; and (ii) bond pad areas of the semiconductor wafer.

In one embodiment, the aforementioned semiconductor wafer processing method further comprising: thinning the back side of the semiconductor wafer with a wafer grinding process prior to the laser ablation process.

In one embodiment, the aforementioned semiconductor wafer processing method further comprising: thinning the entire back side of the semiconductor wafer with a global laser ablation process prior to the local and selective laser ablation process.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Figure 1:
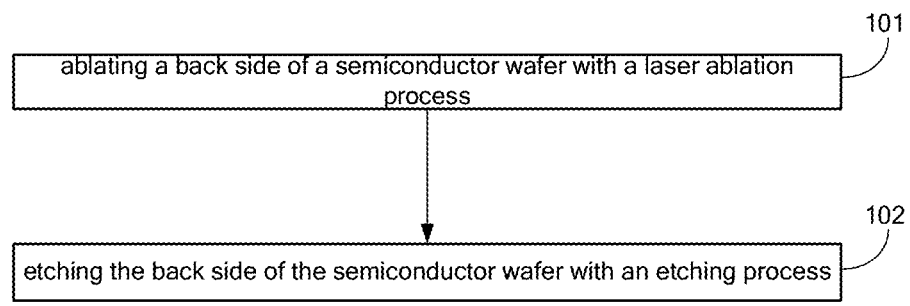
FIG. 1 shows steps of a semiconductor wafer processing method 10 in accordance with an embodiment of the present invention.

In the present disclosure, numerous specific details are provided, such as examples of methods and systems related to the field of semiconductor patterning are disclosed in detail herein, to provide a thorough understanding of embodiments of the invention. The methods and systems disclosed in this section are nonlimiting embodiments of the invention, are provided for explanatory purposes only, and should not be used to constrict the full scope of the invention. Persons of ordinary skill in the art will recognize, however, that the invention can be practiced without one or more of the specific details. It is noted that, for purposes of illustrative clarity, certain elements in the drawings may not be drawn to scale. In other instances, well-known details are not shown or described to avoid obscuring aspects of the invention.

Throughout this disclosure, the example of a semiconductor wafer is provided as an example of a semiconductor element that can be patterned using the disclosed embodiments. However, the disclosed embodiments are more broadly applicable to patterning semiconductor materials generally, and nothing about this disclosure should be understood as limiting the application of the disclosed embodiments to semiconductor wafer processing. Furthermore, throughout this disclosure the example of back side semiconductor wafer processing is provided as an example application of the disclosed embodiments. As used herein, the term "back side" wafer processing is used in accordance with its standard industry meaning and is meant to refer to processing a semiconductor wafer on a side opposite the side proximate the main circuit and interconnect area of the individual semiconductor die formed using the wafer. However, the disclosed embodiments are more broadly applicable to patterning semiconductor wafers generally, and nothing about this disclosure should be understood as limiting the application of the disclosed embodiments to back side wafer processing as the disclosed embodiments can also be applied to front side wafer processing.

FIG. 1 shows steps of a semiconductor wafer processing method 10 in accordance with an embodiment of the present invention. The semiconductor wafer processing method 10 comprises: step 101, ablating a back side of a semiconductor wafer with a laser ablation process; and step 102, etching the back side of the semiconductor wafer with an etching process.

The laser ablation process and the etching process could be conducted at the same time in a laser assisted etching process. Alternatively, the etching process could be conducted as a separate step after the laser ablating process.

In some embodiments of the present invention, the semiconductor wafer processing method 10 further comprises step 103, thinning the back side of the semiconductor wafer with a wafer grinding process prior to the laser ablation process.

In some embodiments of the present invention, the laser ablation process in step 101 is local and selective, and the semiconductor wafer processing method 10 further comprises step 104, thinning the entire back side of the semiconductor wafer with a global laser ablation process prior to the local and selective laser ablation process.

FIGS. 2A-2D shows a set of cross sections 210-240 of a semiconductor wafer 20 that is being processed by the semiconductor wafer processing method 10 in accordance with an embodiment of the present invention.

Figure 2A:
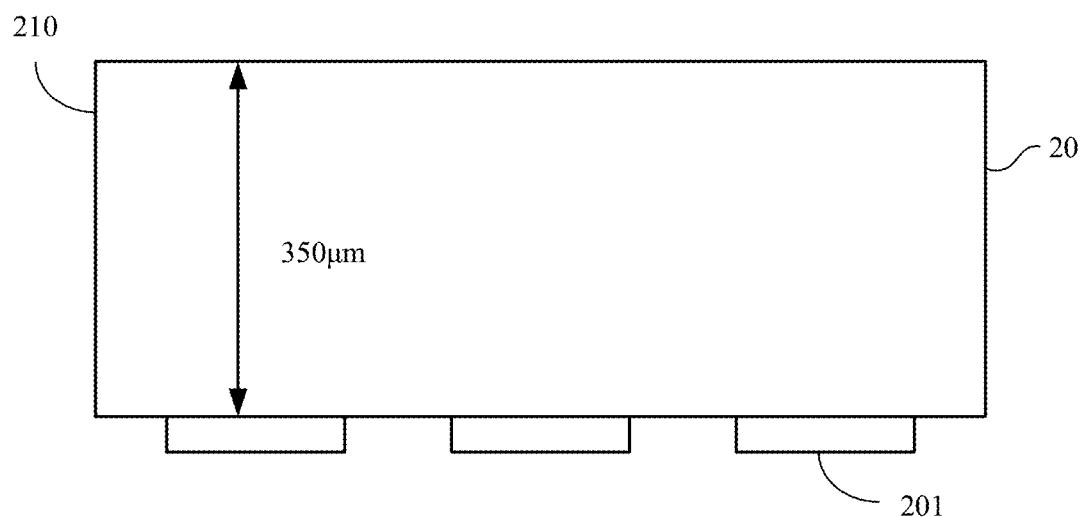
FIGS. 2A-2D shows a set of cross sections 210-240 of a semiconductor wafer 20 that is being processed by the semiconductor wafer processing method 10 in accordance with an embodiment of the present invention.

FIG. 2A shows a cross section 210 of the semiconductor wafer 20 provided with a thickness of 350 microns. The cross section 210 also illustrates how active semiconductor devices 201 have been formed on a front side of the semiconductor wafer 20. The active semiconductor device 201 may be a power device such as a high-power switching transistor. The active semiconductor devices could in the alternative, or in combination, be various types of transistors, like diodes, BJTs (Bipolar Junction Transistor), IGBTs (Insulated Gate Bipolar Transistor), MOSFETs (Metal Oxide Semiconductor Field Effect Transistor), HEMTs (High Electron Mobility Transistor), and many other device types. The transistors could be lateral devices, vertical devices, planar devices, fin device, and/or trench devices.

Figure 2B:
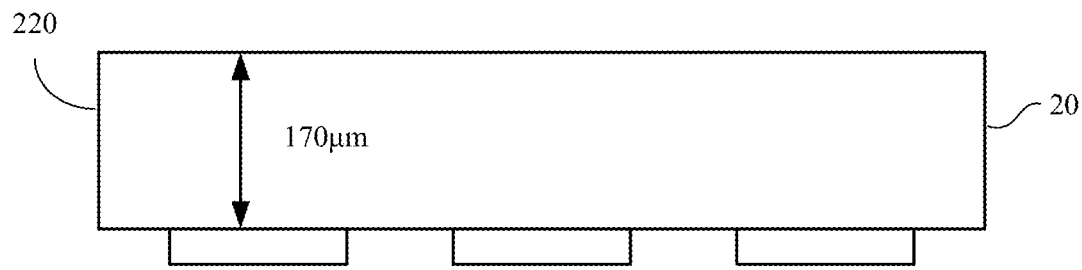

FIG. 2B shows a cross section 220 of the semiconductor wafer 20 after a thinning process, in which the semiconductor wafer has been thinned to 170 microns. The thinning process performed to the semiconductor wafer in FIG. 2A could be a blanket wafer thinning process that reduces the thickness of the wafer from greater than 300 microns to less than 175 microns. The thinning process could include a wafer grinding process using an optional slurry and a grind pad. The grind pad could be moved circularly while in contact with the back side of the semiconductor wafer to grind it down. Alternatively, other approaches for thinning a wafer could be applied such as global laser ablation or a layer transfer process in which a fissure is produced at the top surface of a wafer and a layer of a wafer above the fissure is layer transferred to another carrier. In either case, if the wafer is too thin to retain its own shape and structural stability during the later processing steps, the wafer could be connected to a dedicated handle or another wafer for at least a portion of the manufacturing process. It should be understood that the thinning process is not necessary in some embodiment of the present invention, as the wafers could be purchased in thin form.

Figure 2C:
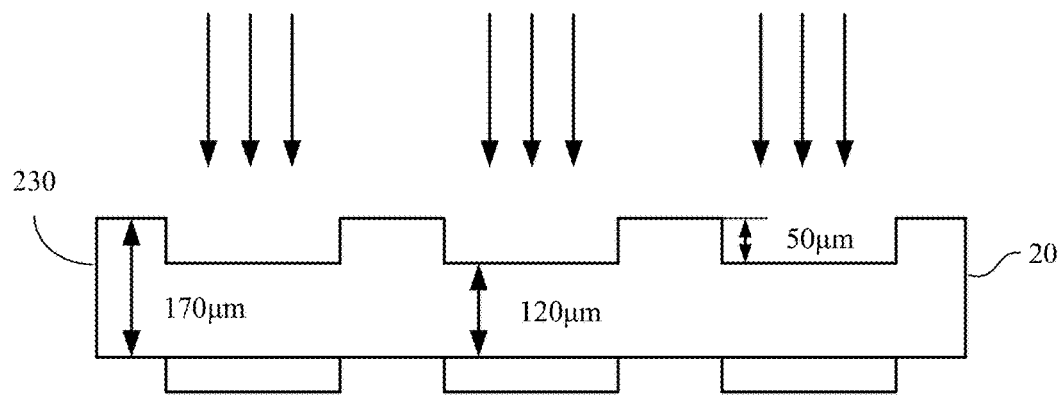

FIG. 2C shows a cross section 230 of the semiconductor wafer 20 after being patterned by a laser ablation process to form a set of trenches that are 50 microns deep. The laser ablation process is sufficient to melt, evaporate, and/or sublimate the semiconductor material in a local area to form a pattern defined by an ablated portion and a negative of the ablated portion. The ablated portion is a portion of the semiconductor wafer where the laser ablation process removes material to form one or more depressions, i.e., the trenches of the cross section 230 in FIG. 2C. It should be known that in other embodiments, the depressions may be valleys, spots, stripes, or various other topologies. The depth of the depressions is measured in a direction extending from the bottom of the depression back up to the original surface of the semiconductor wafer prior to the start of the ablation process. As illustrated in FIG. 2C, the ablated portion is formed in proximity to the active semiconductor devices 201 formed on the front side of the semiconductor wafer. With the back side of the semiconductor devices 201 being thinned, the on resistance of the semiconductor devices 201 is reduced. Meanwhile, the thermal resistance performance of the semiconductor wafer is improved by providing a shorter route for heat to flow out and away from the semiconductor devices 201.

The laser ablation process in the present disclosure may comprise the application of high intensity light to the back side of the semiconductor wafer by a laser. The laser could be aligned with the semiconductor wafer. In some embodiments of the present invention, the laser may be aligned with the semiconductor wafer in advance. The process then comprises an aligning step of aligning the semiconductor wafer with the laser for the laser ablation process by an alignment process. The alignment process is conducted with sufficient precision and accuracy such that an alignment of the pattern with the features in the semiconductor wafer is less than 100 microns. In some implementations, the alignment of the pattern could be less than 50 microns. The alignment process could be conducted in various ways. For example, in the case of thin translucent wafers (e.g., a silicon carbide wafer of less than 300 microns in thickness), the alignment process uses an optical camera viewing the wafer from the back side (back side illumination) and uses a feedback system focused on adjusting the position of the wafer with reference to front side or internal features of the wafer. As another embodiment, front side illumination could also be adopted for the alignment process. Furthermore, a laser could be used to illuminate the front side of the wafer from the back side of the wafer and the same optical feedback system mentioned above could be used to align the wafer. In these embodiments, the laser could also be used, at a higher power, in the later ablation process for ablating the semiconductor wafer.

In some embodiments of the present invention, the laser ablation process has various forms. The laser ablation process may utilize pulsed ultraviolet laser light with pulse duration less than 100 nanoseconds, laser wavelength less than or equal to 355 nanometers and operating up to a maximum power of 100 Watts. The laser ablation process may also utilize a femtosecond or a picosecond pulsed laser operating at wavelengths such as 532 nanometer and 1064 nanometer. The laser process may utilize lasers with focused spot size ranging from few microns to 100 microns. The laser process may utilize laser spot overlap ranging from few microns to 100 microns. The laser process may comprise a laser repetition rate varying between few Hz to 5 MHz. It should be understood that during the back side laser process, temperature rise on the front side should not affect required mechanical and electrical properties of the devices on the front side of the wafer.

Figure 2D:
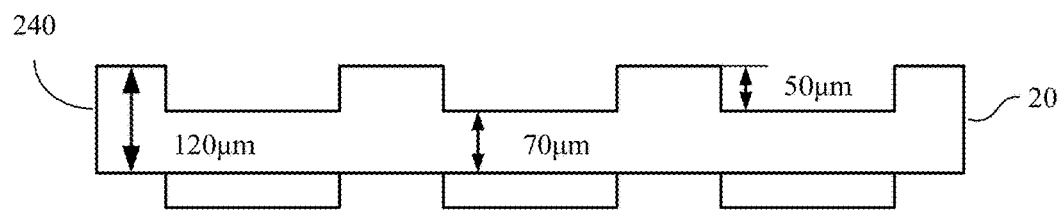

FIG. 2D shows a cross section 240 of the semiconductor wafer 20 after it has been etched by an etching process to thin the wafer an additional 50 microns. The etching process utilized is a blanket isotropic etching process which has preserved the pattern formed by the laser ablation process such that the ablated portions of the pattern are now 70 microns and the unablated portions are 120 microns. The etching process further reduces the thickness of the semiconductor wafer, thus further reduces the on resistance of the semiconductor devices and improves the thermal resistance performance of the semiconductor wafer.

The etching process in the present disclosure may comprise a chemical etch, a plasma etch, a reactive ion etch, or any other etching procedure known to those of ordinary skill in the art. In some embodiments, the etch is selective for different types of materials and the semiconductor wafer could have an etch stop which takes advantage of this selectivity. For example, if the semiconductor wafer comprises an active layer of high doping, and/or isolation features, formed at a given depth into a more-weakly doped active area, the etching process could be selective for that higher doped material such that it naturally terminated at the high doped active layer. In the embodiment of FIG. 2D, the etching process is applied to etch the semiconductor material in a blanket fashion across an entire back side surface of the semiconductor wafer.

In some embodiments of the present invention, the etching process is a lower temperature process than the laser ablation process. The lower temperature process causes a lower degree of localized heating at a specific portion of the semiconductor wafer. In specific embodiments of the present invention, the laser ablation process takes place when the average thickness of the semiconductor wafer is larger than the average thickness of the semiconductor wafer when the etching process is complete. As such, the higher temperature laser ablation process could be conducted while a larger portion of the semiconductor wafer is available to shield any devices on the opposite side of the semiconductor wafer from the heat generated by the laser ablation process, while the lower temperature process could be used to finalize the thinning of the semiconductor wafer to a desired final average thickness. The etching process conducted after the laser ablation process smooth the pattern while reducing the average wafer thickness, and saves the need to ablate the semiconductor material near the active devices, which may rise temperature on the front side and affect required mechanical and electrical properties of the semiconductor devices on the front side of the semiconductor wafer. As a result, there would be a low thermal impact on the front side of the semiconductor wafer as the thickness of the semiconductor wafer is aggressively reduced.

By utilizing the laser ablation process and the etching process, the semiconductor wafer has been patterned with a high etch rate and a low laser power, and meanwhile without the use of a hard mask or photosensitive material.

In the embodiment of FIG. 2C, the laser ablation process forms a pattern across the back side of a semiconductor wafer where the pattern is defined by the ablated portion of the back side of the semiconductor wafer with a single depth. With reference to FIG. 2C, the ablated portion is represented by the three separate trenches formed under the active devices of the semiconductor wafer. The laser ablation process for a pattern with a single depth could be formed by a single pass and single power level applied across the back side of the semiconductor wafer.

The depth of the trenches in FIG. 2C is fixed. As such the pattern is a binary pattern where one value of the pattern is an original surface of the semiconductor wafer prior to the ablation process, i.e., an unablated portion or the negative of the ablated portion, and the other value of the pattern is the depth of the ablated portion relative to the unablated portion. Alternatively, the depth may vary continuously or according to a set of fixed steps as the characteristics of the ablating process is varied across the back side of the semiconductor wafer. As such the pattern is a multivalued pattern where a zero value of the pattern is an original surface of the semiconductor wafer prior to the ablation process and the other values of the pattern are different depths of the ablated portion relative to the unablated portion. The laser ablation process may comprise: (1) a first pass or set of passes in which the pattern is formed; and (2) a second lower temperature pass of lower energy pulses to laser polish the ablated surfaces by melting and solidification.

FIGS. 3A-3D shows a set of cross sections 310-340 of a semiconductor wafer 30 that is being processed by the semiconductor wafer processing method 10 in accordance with an embodiment of the present invention.

Figure 3A:
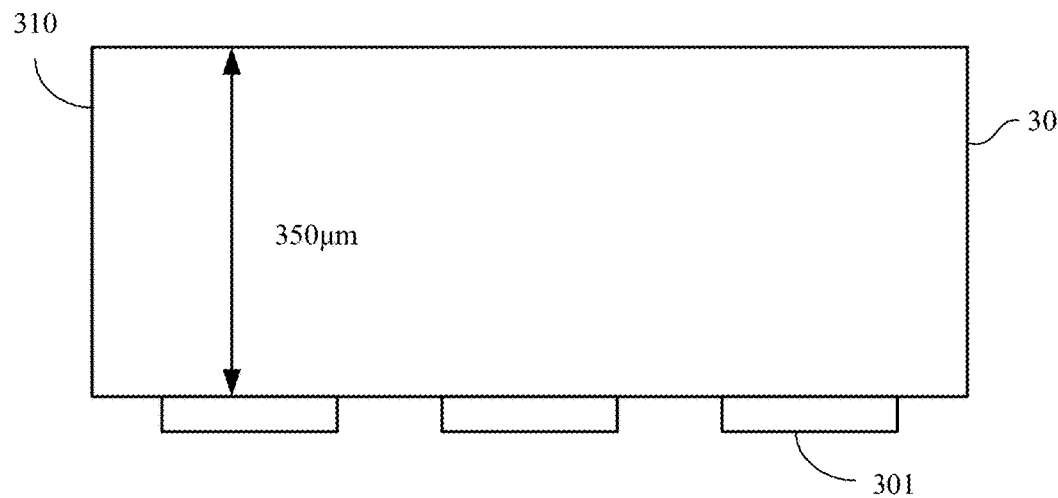
FIGS. 3A-3D shows a set of cross sections 310-340 of a semiconductor wafer 30 that is being processed by the semiconductor wafer processing method 10 in accordance with an embodiment of the present invention.

FIG. 3A shows a cross section 310 of the semiconductor wafer 30 provided with a thickness of 350 microns. The cross section 310 also illustrates how active semiconductor devices 301 have been formed on a front side of the semiconductor wafer. Like the active semiconductor devices 201 in FIGS. 2A-2D, the active semiconductor devices 301 could also comprise different types of transistors.

Figure 3B:
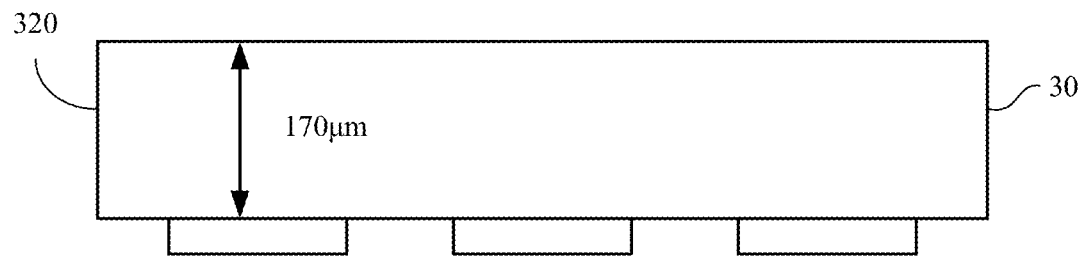

FIG. 3B shows a cross section 320 of the semiconductor wafer 30 after a thinning process, in which the semiconductor wafer has been thinned to 170 microns.

Figure 3C:
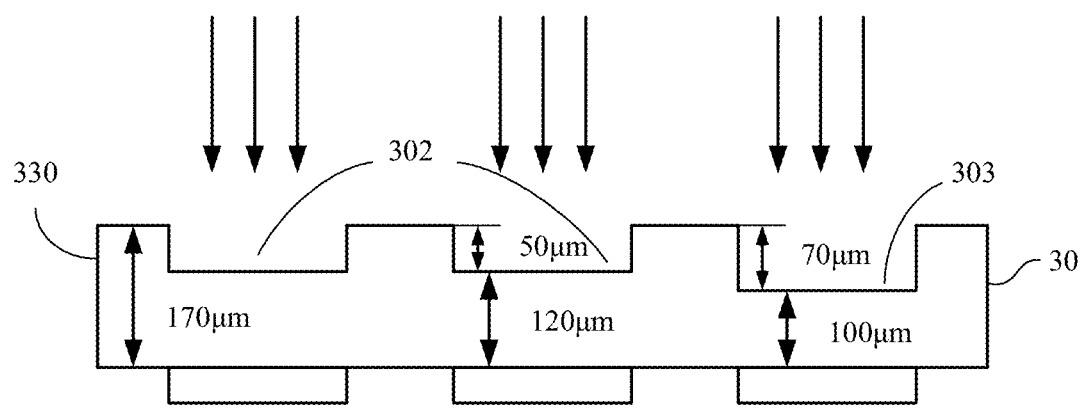

FIG. 3C shows a cross section 330 of the semiconductor wafer 30 after being patterned by a laser ablation process to form a multi-valued pattern. As illustrated in the cross section 330, the ablated portion comprises two trenches 302 with a first depth of 50 microns and a trench 303 with a second depth of 70 microns.

Figure 3D:
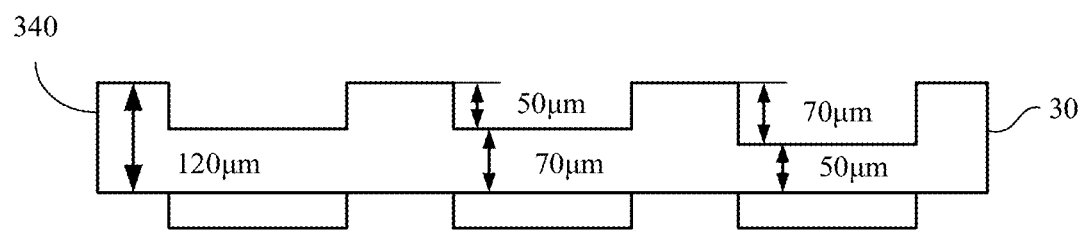

The process then continues to form a cross section 340 after a blanket etch which reduces the thickness of the semiconductor wafer another 50 microns while preserving the multi-value pattern in FIG. 3D.

The embodiment of FIGS. 3A-3D is suitable for semiconductor wafers with different kinds of active devices formed in the semiconductor wafer which have different specifications in terms of heat dissipation and other factors which require a thinner or thicker layer of semiconductor material underneath them. Additionally, the different thicknesses could be formed under other features of the semiconductor wafer such as having thicker regions under bond pads, scribe lines, or other exclusion areas, and thinner areas under active devices.

In the embodiments of FIG. 3C, the ablated portion is represented by the three separate trenches formed under the active devices 301 of the semiconductor wafer 30. The laser ablation process for a multi-valued pattern with a plurality of depths could be conducted by either multiple passes of a laser, multiple power levels for the laser, or a combination of those approaches. For example, the laser may scan across the back side of the semiconductor wafer and increase its power level or apply multiple scans at points where the pattern requires a deeper trench and decrease its power level or decrease number of scans at points where the pattern does not need to be that deep.

Compared to traditional lithography approaches in which multiple depth patterns are created by using multiple masks for etches of different depths, the laser ablation process for multiple depth patterns saves the fixed cost of the processing line as well as the variable cost due to the increased time associated with each masking step.

In the embodiments of FIGS. 2D and 3D, the etching processes are a blanket etch. However, in some embodiments of the present invention, the etching process could also be a pattern etch. In either case, the etching process could preserve the pattern of the laser ablation process. The pattern of the laser ablation process is preserved both in terms of the distinction between the ablated and unablated portions of the semiconductor wafer as well as in the relative depths of different portions of the ablated portions if the pattern is a multi-value pattern. A blanket etch preserves the ablated pattern by being an anisometric etch that etches straight down into the back side of the semiconductor wafer. However, partly isometric etching processes could also preserve the pattern to a certain degree while smoothing the pattern by etching a gradual shift from the unablated to ablated portion. A patterned etch involves the introduction of a hard mask and the use of a photoresist layer to transfer the pattern of the hard mask to the semiconductor wafer. In the embodiments in which the etching process is a blanket etch, the entire process can be conducted without a mask. Even in embodiments where a mask is adopted in the etching process, significant benefits could be realized when the laser ablation process creates multiple depths because a single mask could still preserve the differential created by that laser ablation process, resulting in a multi-level pattern with only a single mask.

In the embodiments of the present invention, the patterning of the semiconductor wafer, as patterned by the ablation process and at least partially preserved by the etching process, could be patterned at the wafer, die, or device level of the semiconductor wafer. The pattern could be repeated across the die and devices in the semiconductor wafer or could vary from die to die and device to device. In specific embodiments of the invention, the negative of the ablated portion is located below at least one of the scribe areas of the semiconductor wafer and the wire bond areas of the semiconductor wafer.

Figure 4:
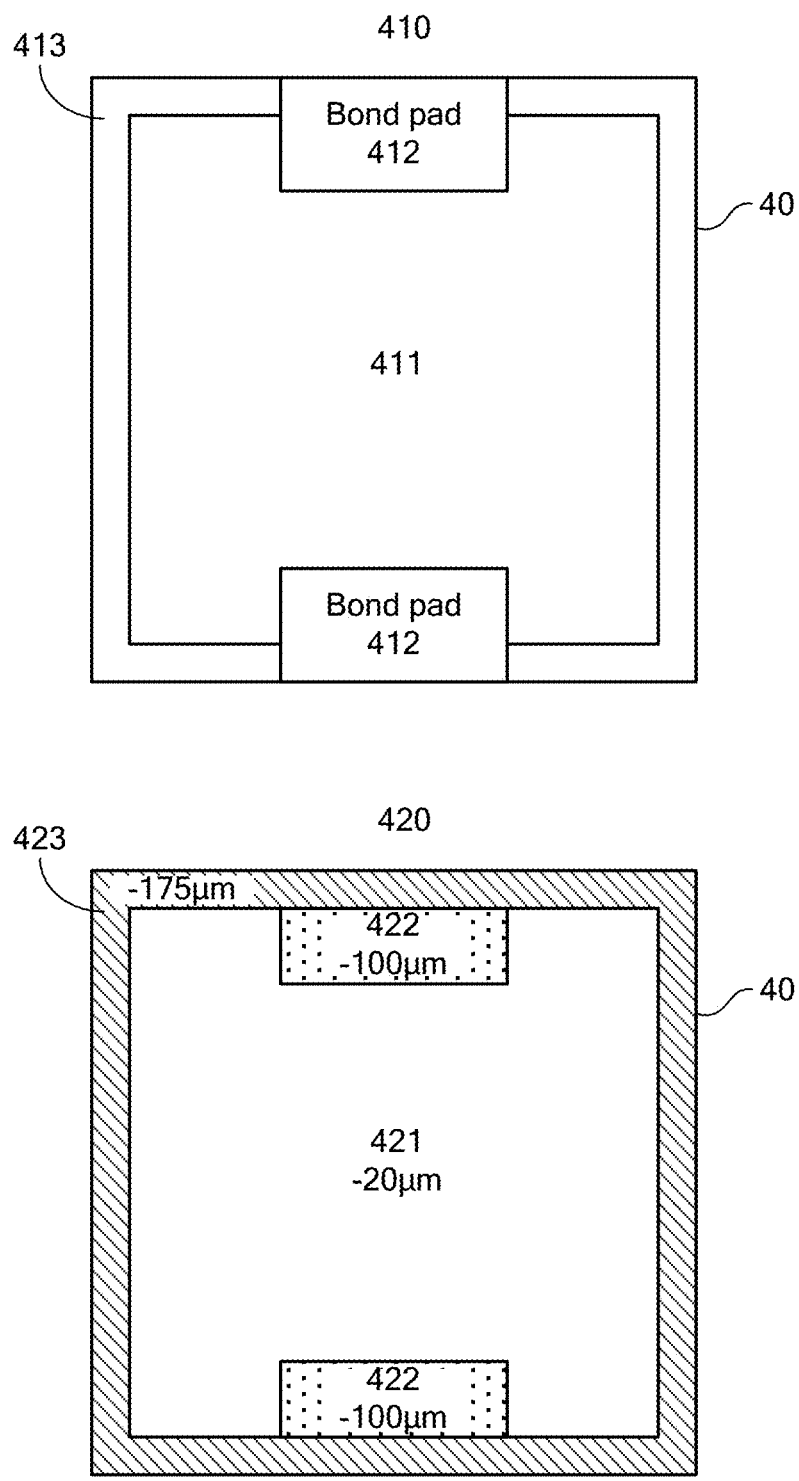
FIG. 4 illustrates a top-down view 410 and bottom-up view 420 of a semiconductor die 40 that has been processed by the semiconductor wafer processing method in accordance with an embodiment of the present invention.

FIG. 4 illustrates a top-down view 410 and bottom-up view 420 of a semiconductor die 40 that has been processed by the semiconductor wafer processing method 10 in accordance with an embodiment of the present invention. As can be seen in the top-down view 410, the semiconductor die 40 comprises two bond pads 412 and a ring of die termination 413. The pattern produced by the grinding, ablating, and etching steps is provided with respect to these features and is visible from the bottom-up view 420. As illustrated, the area 422 beneath the bond pads 412 is etched to a thickness of about 100 microns and the remaining central portion 421 of the die 40 is etched to a thickness of about 20 microns using a combination of the grinding, ablating, and etching steps. This approach is beneficial in that thinning the area 421 could improve the performance of some types of active devices formed in the front side of the die 40 while the area 422 beneath the bond pads 412 is kept thicker to support the stress introduced by attaching a bond wire to the die 40. Furthermore, the area 423 beneath the die termination 413 has been thinned to a thickness of 175 microns by a grinding process alone. The die termination area 423 is therefore not patterned by the ablation process and is also masked during the etching process. It should be known that the bond pad comprises any pad on the die that used for bonding, including but not limited to wire bonding.

Figure 5:
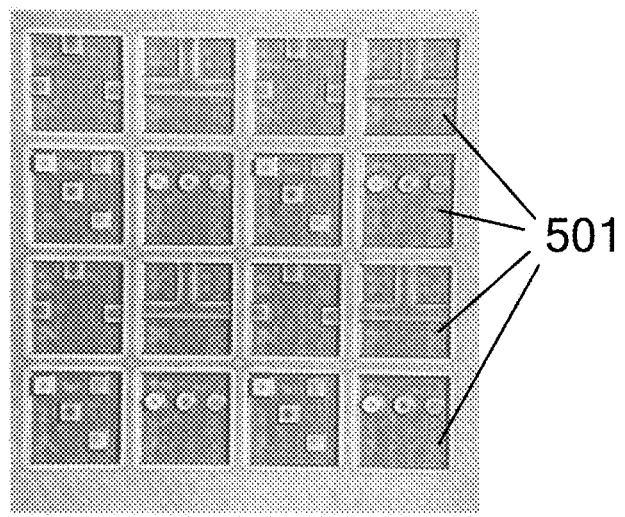
FIG. 5 illustrates a top-down micrograph and axonometric of a variety of patterns created by the semiconductor wafer processing method in accordance with embodiments of the present invention.
Figure 5:
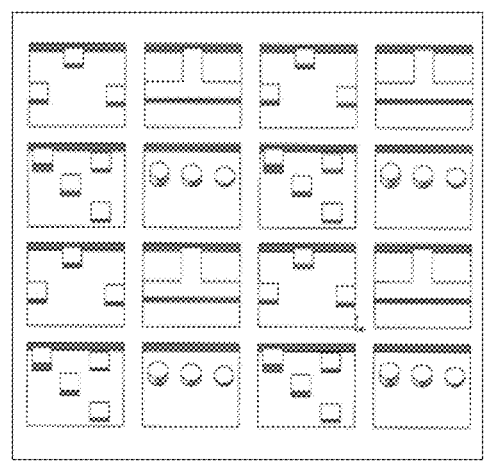

FIG. 5 illustrates a top-down micrograph and axonometric drawing of a variety of patterns created by the semiconductor wafer processing method 10 in accordance with embodiments of the present invention. View 500 is a top-down micrograph of various die-level patterns that have been formed in the back of a SiC wafer using a laser ablation process. Squares 501 are thinned to 40 microns which surround portions of a multilevel pattern formed in the squares 501. View 510 is an axonometric illustration of the same patterns to show that the patterns exhibit a plurality of depths with uniform edges between the ablated and nonablated portions and consistency in the variant depths of the ablated portions. As illustrated, the edges of the pattern could be sharp lines, to create strips or blocks in the pattern, or curved to create pedestals in the pattern. Given that different portions of the pattern are created independently through the focused application of laser light to disparate portions of the wafer, the process could also create patterns with combinations of curved and sharp edges.

Specific implementations of the process disclosed herein could utilize various semiconductor materials. For example, the semiconductor wafer used for the processes described above may be silicon, silicon carbide, gallium nitride, gallium arsenide, gallium oxide, and diamond. In the case of silicon carbide, the dopants may comprise aluminum or boron as a p-type dopant and phosphorous or nitrogen as an n-type dopant. In the case of gallium nitride, the dopants can include magnesium as a p-type dopant and silicon or oxygen as an n-type dopant. The various regions of material disclosed herein can therefore be formed in various semiconductor materials such as silicon carbide and be activated through the introduction of a compatible dopant species for the selected semiconductor material to form active regions such as channel, channel control, drain, and source regions.

While the specification has been described in detail with respect to specific embodiments of the invention, it will be appreciated that those skilled in the art, upon attaining an understanding of the foregoing, may readily conceive of alterations to, variations of, and equivalents to these embodiments. For example, although III-V materials were provided by way of example, specific embodiments disclosed herein are broadly applicable to any form of semiconductor technology. These and other modifications and variations to the present invention may be practiced by those skilled in the art, without departing from the scope of the present invention, which is more particularly set forth in the appended claims.

What is claimed is:

1. A semiconductor wafer processing method, comprising:
    ablating a back side of a semiconductor wafer with a laser ablation process to form a pattern in the back side of the semiconductor wafer, wherein the pattern is defined by an ablated portion and an unablated portion of the semiconductor wafer; and
    etching the back side of the semiconductor wafer with an etching process to reduce a thickness of the ablated portion and a thickness of the unablated portion;
    wherein the etching process preserves the pattern in the back side of the semiconductor wafer.

2. The semiconductor wafer processing method of claim 1, wherein the etching process is conducted after the laser ablation process.

3. The semiconductor wafer processing method of claim 1, wherein the etching process and the laser ablation process are conducted simultaneously.

4. The semiconductor wafer processing method of claim 1, wherein the pattern in the back side of the semiconductor wafer has a single depth and is formed by the laser ablation process with single pass and single power level.

5. The semiconductor wafer processing method of claim 1, wherein the pattern in the back side of the semiconductor wafer has a plurality of depths and is formed by the laser ablation process with at least one of: (i) multiple passes; and (ii) multiple power levels.

6. The semiconductor wafer processing method of claim 1, wherein
    the etching process comprises a blanket anisometric etch applied to the back side of the semiconductor wafer; and
    the etching process preserves the pattern while reducing an average wafer thickness of the semiconductor wafer.

7. The semiconductor wafer processing method of claim 1, wherein
    the etching process is a blanket etch, is at least partially isometric, and is applied to the back side of the semiconductor wafer; and
    the etching process preserves the pattern while reducing an average wafer thickness of the semiconductor wafer.

8. The semiconductor wafer processing method of claim 1, wherein the etching process comprises a reactive ion etching process.

9. The semiconductor wafer processing method of claim 1, wherein:
    the unablated portion is located below at least one of:
        (i) scribe areas of the semiconductor wafer; and (ii) wire bond areas of the semiconductor wafer.

10. The semiconductor wafer processing method of claim 1, wherein:
    the unablated portion is located below at least one of:
        (i) scribe areas of the semiconductor wafer; and (ii) bond pad areas of the semiconductor wafer.

11. The semiconductor wafer processing method of claim 1, wherein:
    the ablated portion has a depth of at least 20 microns.

12. The semiconductor wafer processing method of claim 1, further comprising:
    thinning the back side of the semiconductor wafer with a wafer grinding process prior to the laser ablation process.

13. The semiconductor wafer processing method of claim 1, wherein the laser ablation process is local and selective, and the semiconductor wafer processing method further comprising:
    thinning the entire back side of the semiconductor wafer with a global laser ablation process prior to the local and selective laser ablation process.

14. The semiconductor wafer processing method of claim 1, wherein:
    the semiconductor wafer has an average thickness of less than 300 microns before laser ablation process; and
    the ablated portion has a depth of at least 20 microns.

15. The semiconductor wafer processing method of claim 1, wherein the semiconductor wafer comprises an active semiconductor device formed in a front side of the semiconductor wafer prior to the laser ablation process.

16. The semiconductor wafer processing method of claim 15, wherein:
    the semiconductor wafer is one of: (i) a silicon carbide wafer; (ii) a gallium nitride wafer; and (iii) a gallium arsenide wafer.

17. The semiconductor wafer processing method of claim 15, wherein the active semiconductor device comprises a power device.

18. The semiconductor wafer processing method of claim 1, further comprising:
    aligning the semiconductor wafer and a laser with an alignment process prior to the laser ablation process, wherein the laser is adopted for the laser ablation process.

19. The semiconductor wafer processing method of claim 18, wherein:
    the alignment process comprises a front side illumination of the semiconductor wafer.

20. The semiconductor wafer processing method of claim 18, wherein:
    the alignment process comprises a back side illumination of the semiconductor wafer with the laser.

* * * * *